(12) United States Patent
Sakamoto et al.

(10) Patent No.: US 7,314,651 B2
(45) Date of Patent: Jan. 1, 2008

(54) FILM FORMING METHOD AND FILM FORMING DEVICE

(75) Inventors: Hitoshi Sakamoto, Takasago (JP); Noriaki Ueda, Kobe (JP); Takashi Sugino, 3-4-1-322, Kamishinden, Toyonaka-shi, Osaka 565-0085 (JP)

(73) Assignee: Takashi Sugino, Osaka (JP)

( * ) Notice: Subject to any disclaimer, the term of this patent is extended or adjusted under 35 U.S.C. 154(b) by 701 days.

(21) Appl. No.: 10/472,822

(22) PCT Filed: Mar. 28, 2002

(86) PCT No.: PCT/JP02/03074

§ 371 (c)(1),
(2), (4) Date: Sep. 25, 2003

(87) PCT Pub. No.: WO02/080259

PCT Pub. Date: Oct. 10, 2002

(65) Prior Publication Data

US 2004/0115349 A1 Jun. 17, 2004

(30) Foreign Application Priority Data

Mar. 28, 2001 (JP) .............................. 2001-093502

(51) Int. Cl.
*H05H 1/24* (2006.01)
*C23C 16/00* (2006.01)

(52) U.S. Cl. .................................. 427/569; 427/255.23

(58) Field of Classification Search ...................... None
See application file for complete search history.

(56) References Cited

U.S. PATENT DOCUMENTS

| | | | | |
|---|---|---|---|---|
| 5,286,533 A | * | 2/1994 | Komatsu et al. ............. | 427/554 |
| 5,316,804 A | * | 5/1994 | Tomikawa et al. .......... | 427/569 |
| 5,324,690 A | * | 6/1994 | Gelatos et al. .............. | 438/634 |
| 6,383,465 B1 | * | 5/2002 | Matsumoto et al. ......... | 423/290 |

FOREIGN PATENT DOCUMENTS

| | | |
|---|---|---|
| JP | 3-79769 A | 4/1991 |
| JP | 63-37637 A | 2/1998 |
| JP | 63-83273 A | 4/1998 |
| JP | 10-265955 A | 10/1998 |

* cited by examiner

*Primary Examiner*—Timothy Meeks
*Assistant Examiner*—Kelly M Stouffer
(74) *Attorney, Agent, or Firm*—Birch, Stewart, Kolasch & Birch, LLP

(57) ABSTRACT

A plasma 10 is generated within a film formation chamber 2, and mainly a nitrogen gas 11 is excited within the film formation chamber 2. Then, the excited nitrogen gas 11 is mixed with a diborane gas 13 diluted with a hydrogen gas to react them, thereby forming a boron nitride film 15 on a substrate 4. At the initial stage of film formation, the nitrogen gas 11 is supplied in excess to suppress the occurrence of an amorphous phase on the interface. As a result, the boron nitride film 15 improved in moisture absorption resistance on the interface with the substrate and maintaining low dielectric constant properties is formed.

9 Claims, 8 Drawing Sheets

US 7,314,651 B2

FILM FORMING METHOD AND FILM FORMING DEVICE

This application is the national phase under 35 U.S.C. § 371 of PCT International Application No. PCT/JP02/03074 which has an International filing date of Mar. 28, 2002, which designated the United States of America.

TECHNICAL FIELD

This invention relates to a film forming method and a film forming apparatus for forming a boron nitride film and a boron carbonitride film.

BACKGROUND ART

In an integrated circuit, a silicon dioxide film ($SiO_2$ film) by the plasma CVD (chemical vapor deposition) method has so far been used as an interlayer dielectric film. However, because of high integration of transistors and speeding of a switching action, losses due to capacitance between wirings have posed problems. To eliminate these losses, it is necessary to decrease the relative dielectric constant of the interlayer dielectric film, so that an interlayer dielectric film with a lower relative dielectric constant has been demanded. Under these circumstances, films of organic materials (for example, organosilicon films or films of amorphous carbon incorporating fluorine) can be provided with a very low relative dielectric constant (relative dielectric constant $\kappa=2.5$ or less), but these films have been problematical in mechanical and chemical resistance and thermal conductivity. Adhesion of the films has also presented a problem, and their moisture absorption resistance has been a problem in terms of density.

Under these circumstances, boron nitride (BN) and boron carbonitride (BNC), which are excellent in heat resistance and have a very low relative dielectric constant (relative dielectric constant $\kappa=2.5$ or less), are attracting attention. However, techniques for forming a BN film or a BNC film by the plasma CVD (chemical vapor deposition) method have not been established, and the advent of a film forming method and a film forming apparatus capable of forming a BN film and a BNC film as products is in eager demand.

The present invention has been accomplished in view of the above situations, and its object is to provide a film forming method and a film forming apparatus which can form films of boron nitride and boron carbonitride.

DISCLOSURE OF THE INVENTION

The film forming method of the present invention comprises generating a plasma within a film formation chamber, exciting mainly a nitrogen gas within the film formation chamber, and then mixing the excited nitrogen gas with a boron-based gas to react them, thereby forming a boron nitride film on a substrate, the method characterized by supplying an amorphous phase occurrence suppressing gas at an initial stage of film formation to suppress occurrence of an amorphous phase on an interface.

Because of this feature, there can be formed a boron nitride film improved in moisture absorption resistance on the substrate interface and maintaining low dielectric constant properties.

The film forming method of the present invention comprises generating a plasma within a film formation chamber, exciting mainly a nitrogen gas within the film formation chamber, and then mixing the excited nitrogen gas with a boron-based gas to react them, thereby forming a boron nitride film on a substrate, the method characterized by rendering a flow rate of the nitrogen gas present in excess at an initial stage of film formation to suppress occurrence of an amorphous phase on an interface.

Because of this feature, there can be formed a boron nitride film improved in moisture absorption resistance on the substrate interface and maintaining low dielectric constant properties.

The film forming method of the present invention comprises generating a plasma within a film formation chamber, exciting mainly a nitrogen gas within the film formation chamber, and then mixing the excited nitrogen gas with a boron-based gas to react them, thereby forming a boron nitride film on a substrate, the method characterized by rendering a flow rate of a hydrogen gas present in excess at an initial stage of film formation to suppress occurrence of an amorphous phase on an interface.

Because of this feature, there can be formed a boron nitride film improved in moisture absorption resistance on the substrate interface and maintaining low dielectric constant properties.

The film forming method of the present invention comprises generating a plasma within a film formation chamber, exciting mainly a nitrogen gas within the film formation chamber, and then mixing the excited nitrogen gas with a boron-based gas and an organic gas or evaporated carbon to react them, thereby forming a boron carbonitride film on a substrate, the method characterized by supplying an amorphous phase occurrence suppressing gas at an initial stage of film formation to suppress occurrence of an amorphous phase on an interface.

Because of this feature, there can be formed a boron carbonitride film improved in moisture absorption resistance on the substrate interface and maintaining low dielectric constant properties.

The film forming method of the present invention comprises generating a plasma within a film formation chamber, exciting mainly a nitrogen gas within the film formation chamber, and then mixing the excited nitrogen gas with a boron-based gas and an organic gas or evaporated carbon to react them, thereby forming a boron carbonitride film on a substrate, the method characterized by rendering a flow rate of the nitrogen gas present in excess at an initial stage of film formation to suppress occurrence of an amorphous phase on an interface.

Because of this feature, there can be formed a boron carbonitride film improved in moisture absorption resistance on the substrate interface and maintaining low dielectric constant properties.

The film forming method of the present invention comprises generating a plasma within a film formation chamber, exciting mainly a nitrogen gas within the film formation chamber, and then mixing the excited nitrogen gas with a boron-based gas and an organic gas or evaporated carbon to react them, thereby forming a boron carbonitride film on a substrate, the method characterized by rendering a flow rate of a hydrogen gas present in excess at an initial stage of film formation to suppress occurrence of an amorphous phase on an interface.

Because of this feature, there can be formed a boron carbonitride film improved in moisture absorption resistance on the substrate interface and maintaining low dielectric constant properties.

The film forming method of the present invention comprises generating a plasma within a film formation chamber, exciting mainly a nitrogen gas within the film formation chamber, and then mixing the excited nitrogen gas with a boron-based gas and an organic gas or evaporated carbon to react them, thereby forming a boron carbonitride film on a substrate, the method characterized by rendering a flow rate of a hydrocarbon-based gas present in excess at an initial stage of film formation to suppress occurrence of an amorphous phase on an interface.

Because of this feature, there can be formed a boron carbonitride film improved in moisture absorption resistance on the substrate interface and maintaining low dielectric constant properties.

The film forming method of the present invention comprises generating a plasma within a film formation chamber, exciting mainly a nitrogen gas within the film formation chamber, and then mixing the excited nitrogen gas with a boron-based gas to react them, thereby forming a boron nitride film on a substrate, the method characterized by rendering a flow rate of the boron-based gas present in excess at a final stage of film formation to promote occurrence of an amorphous phase on a surface of the film, and also mixing an amorphous phase inactivating gas.

Because of this feature, there can be formed a boron nitride film increased in density on the surface of the film and maintaining low dielectric constant properties, with metal diffusion being suppressed and without impairment of moisture absorption properties.

The film forming method of the present invention comprises generating a plasma within a film formation chamber, exciting mainly a nitrogen gas within the film formation chamber, and then mixing the excited nitrogen gas with a boron-based gas to react them, thereby forming a boron nitride film on a substrate, the method characterized by rendering a flow rate of the boron-based gas present in excess at a final stage of film formation to promote occurrence of an amorphous phase on a surface of the film, and also mixing a hydride to inactivate an amorphous phase.

Because of this feature, there can be formed a boron nitride film increased in density on the surface of the film and maintaining low dielectric constant properties, with metal diffusion being suppressed and without impairment of moisture absorption properties.

The film forming method of the present invention comprises generating a plasma within a film formation chamber, exciting mainly a nitrogen gas within the film formation chamber, and then mixing the excited nitrogen gas with a boron-based gas and an organic gas or evaporated carbon to react them, thereby forming a boron carbonitride film on a substrate, the method characterized by rendering a flow rate of the boron-based gas present in excess at a final stage of film formation to promote occurrence of an amorphous phase on a surface of the film, and also mixing an amorphous phase inactivating gas.

Because of this feature, there can be formed a boron carbonitride film increased in density on the surface of the film and maintaining low dielectric constant properties, with metal diffusion being suppressed and without impairment of moisture absorption properties.

The film forming method of the present invention comprises generating a plasma within a film formation chamber, exciting mainly a nitrogen gas within the film formation chamber, and then mixing the excited nitrogen gas with a boron-based gas and an organic gas or evaporated carbon to react them, thereby forming a boron carbonitride film on a substrate, the method characterized by rendering a flow rate of the boron-based gas present in excess at a final stage of film formation to promote occurrence of an amorphous phase on a surface of the film, and also mixing a hydride to inactivate the amorphous phase.

Because of this feature, there can be formed a boron carbonitride film increased in density on the surface of the film and maintaining low dielectric constant properties, with metal diffusion being suppressed and without impairment of moisture absorption properties.

The film forming method of the present invention comprises generating a plasma within a film formation chamber, exciting mainly a nitrogen gas within the film formation chamber, and then mixing the excited nitrogen gas with a boron-based gas and an organic gas or evaporated carbon to react them, thereby forming a boron carbonitride film on a substrate, the method characterized by rendering a flow rate of the boron-based gas present in excess at a final stage of film formation to promote occurrence of an amorphous phase on a surface of the film, and also stopping the plasma and mixing a hydrocarbon material to inactivate the amorphous phase.

Because of this feature, there can be formed a boron carbonitride film increased in density on the surface of the film and maintaining low dielectric constant properties, with metal diffusion being suppressed and without impairment of moisture absorption properties.

The film forming method of the present invention comprises generating a plasma within a film formation chamber, exciting mainly a nitrogen gas within the film formation chamber, and then mixing the excited nitrogen gas with a boron-based gas and an organic gas or evaporated carbon to react them, thereby forming a boron carbonitride film on a substrate, the method characterized by rendering a flow rate of the boron-based gas present in excess at a final stage of film formation to promote occurrence of an amorphous phase on a surface of the film, and also stopping the plasma and mixing a hydride and a hydrocarbon material to inactivate the amorphous phase.

Because of this feature, there can be formed a boron carbonitride film increased in density on the surface of the film and maintaining low dielectric constant properties, with metal diffusion being suppressed and without impairment of moisture absorption properties.

The film forming method of the present invention comprises generating a plasma within a film formation chamber, exciting mainly a nitrogen gas within the film formation chamber, and then mixing the excited nitrogen gas with a boron-based gas to react them, thereby forming a boron nitride film on a substrate, the method characterized by supplying an amorphous phase occurrence suppressing gas at an initial stage of film formation to suppress occurrence of an amorphous phase on an interface, rendering a flow rate of the boron-based gas present in excess at a final stage of film formation to promote occurrence of an amorphous phase on a surface of the film, and also mixing an amorphous phase inactivating gas.

Because of this feature, there can be formed a boron nitride film improved in moisture absorption resistance on the substrate interface, maintaining low dielectric constant properties, increased in density on the surface of the film and maintaining low dielectric constant properties, with metal diffusion being suppressed and without impairment of moisture absorption properties.

The film forming method of the present invention comprises generating a plasma within a film formation chamber, exciting mainly a nitrogen gas within the film formation chamber, and then mixing the excited nitrogen gas with a boron-based gas and an organic gas or evaporated carbon to react them, thereby forming a boron carbonitride film on a substrate, the method characterized by supplying an amorphous phase occurrence suppressing gas at an initial stage of film formation to suppress occurrence of an amorphous phase on an interface, rendering a flow rate of the boron-based gas present in excess at a final stage of film formation to promote occurrence of an amorphous phase on a surface of the film, and also mixing an amorphous phase inactivating gas.

Because of this feature, there can be formed a boron carbonitride film improved in moisture absorption resistance on the substrate interface, maintaining low dielectric constant properties, increased in density on the surface of the film and maintaining low dielectric constant properties, with metal diffusion being suppressed and without impairment of moisture absorption properties.

The film forming method is characterized in that the boron-based gas is a diborane gas diluted with a hydrogen gas.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas to an interior of the film formation chamber below the nitrogen gas introduction means, and suppressing gas introduction means for introducing an amorphous phase occurrence suppressing gas at an initial stage of film formation in order to suppress occurrence of an amorphous phase on an interface.

Because of this feature, a plasma is generated within a film formation chamber, mainly a nitrogen gas is excited within the film formation chamber, and then the excited nitrogen gas is mixed with a boron-based gas to react them, thereby forming a boron nitride film on a substrate. In this process, an amorphous phase occurrence suppressing gas is supplied at an initial stage of film formation, whereby occurrence of an amorphous phase on an interface can be suppressed. As a result, there can be formed a boron nitride film improved in moisture absorption resistance on the substrate interface and maintaining low dielectric constant properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas to an interior of the film formation chamber below the nitrogen gas introduction means, and suppressing gas introduction means for introducing a nitrogen gas at an initial stage of film formation in order to render a flow rate of the nitrogen gas present in excess within the film formation chamber and suppress occurrence of an amorphous phase on an interface.

Because of this feature, a plasma is generated within a film formation chamber, mainly a nitrogen gas is excited within the film formation chamber, and then the excited nitrogen gas is mixed with a boron-based gas to react them, thereby forming a boron nitride film on a substrate. In this process, the flow rate of the nitrogen gas is rendered present in excess at the initial stage of film formation, whereby occurrence of an amorphous phase on an interface can be suppressed. As a result, there can be formed a boron nitride film improved in moisture absorption resistance on the substrate interface and maintaining low dielectric constant properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas to an interior of the film formation chamber below the nitrogen gas introduction means, and suppressing gas introduction means for introducing a hydrogen gas at an initial stage of film formation in order to render a flow rate of the nitrogen gas present in excess within the film formation chamber and suppress occurrence of an amorphous phase on an interface.

Because of this feature, a plasma is generated within a film formation chamber, mainly a nitrogen gas is excited within the film formation chamber, and then the excited nitrogen gas is mixed with a boron-based gas to react them, thereby forming a boron nitride film on a substrate. In this process, the flow rate of a hydrogen gas is rendered present in excess at the initial stage of film formation, whereby occurrence of an amorphous phase on an interface can be suppressed. As a result, there can be formed a boron nitride film improved in moisture absorption resistance on the substrate interface and maintaining low dielectric constant properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas and an organic gas or evaporated carbon to an interior of the film formation chamber below the nitrogen gas introduction means, and suppressing gas introduction means for introducing an amorphous phase occurrence suppressing gas at an initial stage of film formation in order to suppress occurrence of an amorphous phase on an interface.

Because of this feature, a plasma is generated within a film formation chamber, mainly a nitrogen gas is excited within the film formation chamber, and then the excited nitrogen gas is mixed with a boron-based gas and an organic gas or evaporated carbon to react them, thereby forming a boron carbonitride film on a substrate. In this process, an amorphous phase occurrence suppressing gas is supplied at the initial stage of film formation, whereby occurrence of an amorphous phase on an interface can be suppressed. As a result, there can be formed a boron carbonitride film improved in moisture absorption resistance on the substrate interface and maintaining low dielectric constant properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas and an organic gas or evaporated carbon to an interior of the film formation chamber below the nitrogen gas introduction means, and suppressing gas introduction means for introducing a nitrogen gas at an initial stage of film formation in order to render a flow rate of the nitrogen gas present in excess within the film formation chamber and suppress occurrence of an amorphous phase on an interface.

Because of this feature, a plasma is generated within a film formation chamber, mainly a nitrogen gas is excited within the film formation chamber, and then the excited nitrogen gas is mixed with a boron-based gas and an organic gas or evaporated carbon to react them, thereby forming a boron carbonitride film on a substrate. In this process, the flow rate of the nitrogen gas is rendered present in excess at the initial stage of film formation, whereby occurrence of an amorphous phase on an interface can be suppressed. As a result, there can be formed a boron carbonitride film improved in moisture absorption resistance on the substrate interface and maintaining low dielectric constant properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas and an organic gas or evaporated carbon to an interior of the film formation chamber below the nitrogen gas introduction means, and suppressing gas introduction means for introducing a hydrogen gas at an initial stage of film formation in order to render a flow rate of the hydrogen gas present in excess within the film formation chamber and suppress occurrence of an amorphous phase on an interface.

Because of this feature, a plasma is generated within a film formation chamber, mainly a nitrogen gas is excited within the film formation chamber, and then the excited nitrogen gas is mixed with a boron-based gas and an organic gas or evaporated carbon to react them, thereby forming a boron carbonitride film on a substrate. In this process, the flow rate of a hydrogen gas is rendered present in excess at the initial stage of film formation, thereby suppressing occurrence of an amorphous phase on an interface. Thus, there can be formed a boron carbonitride film improved in moisture absorption resistance on the substrate interface and maintaining low dielectric constant properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas and an organic gas or evaporated carbon to an interior of the film formation chamber below the nitrogen gas introduction means, and suppressing gas introduction means for introducing a hydrocarbon-based gas at an initial stage of film formation in order to render a flow rate of the hydrocarbon-based gas present in excess within the film formation chamber and suppress occurrence of an amorphous phase on an interface.

Because of this feature, a plasma is generated within a film formation chamber, mainly a nitrogen gas is excited within the film formation chamber, and then the excited nitrogen gas is mixed with a boron-based gas and an organic gas or evaporated carbon to react them, thereby forming a boron carbonitride film on a substrate. In this process, the flow rate of a hydrocarbon-based gas is rendered present in excess at the initial stage of film formation, whereby occurrence of an amorphous phase on an interface can be suppressed. Thus, there can be formed a boron carbonitride film improved in moisture absorption resistance on the substrate interface and maintaining low dielectric constant properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas to an interior of the film formation chamber below the nitrogen gas introduction means, promoting gas introduction means for rendering a flow rate of the boron-based gas present in excess at a final stage of film formation to promote occurrence of an amorphous phase on a surface of a film, and inactivating gas introduction means for mixing an amorphous phase inactivating gas at the final stage of film formation.

Because of this feature, a plasma is generated within a film formation chamber, a nitrogen gas is mainly excited within the film formation chamber, and then the excited nitrogen gas is mixed with a boron-based gas to react them, thereby forming a boron nitride film on a substrate. In this process, the flow rate of the boron-based gas is rendered present in excess at the final stage of film formation, whereby occurrence of an amorphous phase on the surface of the film can be promoted, and moreover an amorphous phase inactivating gas can be mixed. As a result, there can be formed a boron nitride film increased in density on the surface of the film and maintaining low dielectric constant properties, with metal diffusion being suppressed and without impairment of moisture absorption properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas to an interior of the film formation chamber below the nitrogen gas introduction means, promoting gas introduction means for rendering a flow rate of the boron-based gas present in excess at a final stage of film formation to promote occurrence of an amorphous phase on a surface of a film, and inactivating gas introduction means for mixing a hydrogen gas at the final stage of film formation in order to inactivate the amorphous phase.

Because of this feature, a plasma is generated within a film formation chamber, mainly a nitrogen gas is excited within the film formation chamber, and then the excited nitrogen gas is mixed with a boron-based gas to react them, thereby forming a boron nitride film on a substrate. In this process, the flow rate of the boron-based gas is rendered present in excess at the final stage of film formation, whereby occurrence of an amorphous phase on the surface of the film can be promoted, and moreover a hydride can be mixed to inactivate the amorphous phase. As a result, there can be formed a boron nitride film increased in density on the surface of the film and maintaining low dielectric constant properties, with metal diffusion being suppressed and without impairment of moisture absorption properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas and an organic gas or evaporated carbon to an interior of the film formation chamber below the nitrogen gas introduction means, promoting gas introduction means for rendering a flow rate of the boron-based gas present in excess at a final stage of film formation to promote occurrence of an amorphous phase on a surface of a film, and inactivating gas introduction means for mixing an amorphous phase inactivating gas at the final stage of film formation.

Because of this feature, a plasma is generated within a film formation chamber, mainly a nitrogen gas is excited within the film formation chamber, and then the excited nitrogen gas is mixed with a boron-based gas and an organic gas or evaporated carbon to react them, thereby forming a boron carbonitride film on a substrate. In this process, the flow rate of the boron-based gas is rendered present in excess at the final stage of film formation, whereby occurrence of an amorphous phase on the surface of the film can be promoted, and moreover an amorphous phase inactivating gas can be mixed. As a result, there can be formed a boron carbonitride film increased in density on the surface of the film and maintaining low dielectric constant properties, with metal diffusion being suppressed and without impairment of moisture absorption properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas and an organic gas or evaporated carbon to an interior of the film formation chamber below the nitrogen gas introduction means, promoting gas introduction means for rendering a flow rate of the boron-based gas present in excess at a final stage of film formation to promote occurrence of an amorphous phase on a surface of a film, and inactivating gas introduction means for mixing a nitride at the final stage of film formation in order to inactivate the amorphous phase.

Because of this feature, a plasma is generated within a film formation chamber, mainly a nitrogen gas is excited within the film formation chamber, and then the excited nitrogen gas is mixed with a boron-based gas and an organic gas or evaporated carbon to react them, thereby forming a boron carbonitride film on a substrate. In this process, the flow rate of the boron-based gas is rendered present in excess at the final stage of film formation, whereby occurrence of an amorphous phase on the surface of the film can be promoted, and moreover a hydride is mixed, whereby the amorphous phase can be inactivated. As a result, there can be formed a boron carbonitride film increased in density on the surface of the film and maintaining low dielectric constant properties, with metal diffusion being suppressed and without impairment of moisture absorption properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas and an organic gas or evaporated carbon to an interior of the film formation chamber below the nitrogen gas introduction means, promoting gas introduction means for rendering a flow rate of the boron-based gas present in excess at a final stage of film formation to promote occurrence of an amorphous phase on a surface of a film, and inactivating gas introduction means for mixing a hydrocarbon material at the final stage of film formation in order to inactivate the amorphous phase.

Because of this feature, a plasma is generated within a film formation chamber, mainly a nitrogen gas is excited within the film formation chamber, and then the excited nitrogen gas is mixed with a boron-based gas and an organic gas or evaporated carbon to react them, thereby forming a boron carbonitride film on a substrate. In this process, the flow rate of the boron-based gas is rendered present in excess at the final stage of film formation, whereby occurrence of an amorphous phase on the surface of the film can be promoted, and moreover the plasma is stopped, and a hydrocarbon material is mixed, whereby the amorphous phase can be inactivated. As a result, there can be formed a boron carbonitride film increased in density on the surface of the film and maintaining low dielectric constant properties, with metal diffusion being suppressed and without impairment of moisture absorption properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas and an organic gas or evaporated carbon to an interior of the film formation chamber below the nitrogen gas introduction means, promoting gas introduction means for rendering a flow rate of the boron-based gas present in excess at a final stage of film formation to promote occurrence of an amorphous phase on a surface of a film, and inactivating gas introduction means for mixing a hydride and a hydrocarbon material at the final stage of film formation in order to inactivate the amorphous phase.

Because of this feature, a plasma is generated within a film formation chamber, mainly a nitrogen gas is excited within the film formation chamber, and then the excited nitrogen gas is mixed with a boron-based gas and an organic gas or evaporated carbon to react them, thereby forming a boron carbonitride film on a substrate. In this process, the flow rate of the boron-based gas is rendered present in excess at the final stage of film formation, whereby occurrence of an amorphous phase on the surface of the film can be promoted, and moreover the plasma is stopped, and a hydride and a hydrocarbon material are mixed, whereby the amorphous phase can be inactivated. As a result, there can be formed a boron carbonitride film increased in density on the surface of the film and maintaining low dielectric constant properties, with metal diffusion being suppressed and without impairment of moisture absorption properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas to an interior of the film formation chamber below the nitrogen gas introduction means, suppressing gas introduction means for introducing an amorphous phase occurrence suppressing gas at an initial stage of film formation in order to suppress occurrence of an amorphous phase on an interface, promoting gas introduction means for rendering a flow rate of the boron-based gas present in excess at a final stage of film formation to promote occurrence of an amorphous phase on a surface of a film, and inactivating gas introduction means for mixing an amorphous phase inactivating gas at the final stage of film formation.

Because of this feature, a plasma is generated within a film formation chamber, mainly a nitrogen gas is excited within the film formation chamber, and then the excited nitrogen gas is mixed with a boron-based gas to react them, thereby forming a boron nitride film on a substrate. In this process, an amorphous phase occurrence suppressing gas is supplied at the initial stage of film formation, whereby occurrence of an amorphous phase on an interface can be suppressed. Also, the flow rate of the boron-based gas is rendered present in excess at the final stage of film formation, thereby promoting occurrence of an amorphous phase on the surface of the film, and moreover an amorphous phase inactivating gas can be mixed. As a result, there can be formed a boron nitride film improved in moisture absorption resistance on the substrate interface and maintaining low dielectric constant properties, and also increased in density on the surface of the film and maintaining low dielectric constant properties, with metal diffusion being suppressed and without impairment of moisture absorption properties.

The film forming apparatus of the present invention has plasma generation means provided in an upper part of a film formation chamber for generating a plasma within the film formation chamber, a substrate holding portion provided in a lower part of the film formation chamber, nitrogen gas introduction means for introducing a nitrogen gas into the film formation chamber, boron-based gas introduction means for introducing a boron-based gas and an organic gas or evaporated carbon to an interior of the film formation chamber below the nitrogen gas introduction means, suppressing gas introduction means for introducing an amorphous phase occurrence suppressing gas at an initial stage of film formation in order to suppress occurrence of an amorphous phase on an interface, promoting gas introduction means for rendering a flow rate of the boron-based gas present in excess at a final stage of film formation to promote occurrence of an amorphous phase on a surface of a film, and inactivating gas introduction means for mixing an amorphous phase inactivating gas at the final stage of film formation.

Because of this feature, a plasma is generated within a film formation chamber, mainly a nitrogen gas is excited within the film formation chamber, and then the excited nitrogen gas is mixed with a boron-based gas and an organic gas or evaporated carbon to react them, thereby forming a boron carbonitride film on a substrate. In this process, an amorphous phase occurrence suppressing gas is supplied at the initial stage of film formation, whereby occurrence of an amorphous phase on an interface can be suppressed. Also, the flow rate of the boron-based gas is rendered present in excess at the final stage of film formation, thereby promoting occurrence of an amorphous phase on the surface of the film, and moreover an amorphous phase inactivating gas can be mixed. As a result, there can be formed a boron carbonitride film improved in moisture absorption resistance on the substrate interface and maintaining low dielectric constant properties, and also increased in density on the surface of the film and maintaining low dielectric constant properties, with metal diffusion being suppressed and without impairment of moisture absorption properties.

BEST MODE FOR CARRYING OUT THE INVENTION

In preparing boron nitride (BN) with a low dielectric constant, as an interlayer dielectric film of a highly integrated circuit, by the plasma vapor phase process, diborane ($B_2H_6$) or the like, which is diluted with a hydrogen ($H_2$) gas as a diluent gas, has been used as a boron source, and a nitrogen ($N_2$) gas or the like has been used as a nitrogen source. In preparing a boron carbonitride (BNC) film, on the other hand, tetraethoxysilane ($Si(O-C_2H_5)_4$; hereinafter referred to as TEOS) as an organic gas, evaporated carbon, or the like has further been used as a carbon source. A plasma has been generated in a reactor, and these gases have been mixed there to form the film on a predetermined substrate.

As a problem with formation of the BN film or the BNC film, there is a concern about aggravation of a low dielectric constant due to moisture absorption caused by the presence of an amorphous phase at the interface between the substrate and the film. Moreover, gas escape in subsequent processes is feared. Furthermore, when copper (Cu) is wired, a low density of the surface of the film causes concern about interlayer dielectric breakdown or the like ascribed to diffusion of Cu.

Hence, the present invention has achieved a film forming method and a film forming apparatus which can form a BN film or a BNC film while suppressing an amorphous phase at the interface between a substrate and the film, without aggravating a low dielectric constant. Besides, the present invention has achieved a film forming method and a film forming apparatus capable of forming a BN film or a BNC film which dissolves the lowness of density of the film surface in consideration of moisture absorption resistance, to attain freedom from diffusion of a wired metal (especially Cu), thereby causing no interlayer dielectric breakdown.

To describe the present invention in more detail, the invention will be illustrated in accordance with the accompanying drawings.

The film forming method and the film forming apparatus of the present invention will be described based on FIGS. 1 to 8.

Figure 1:
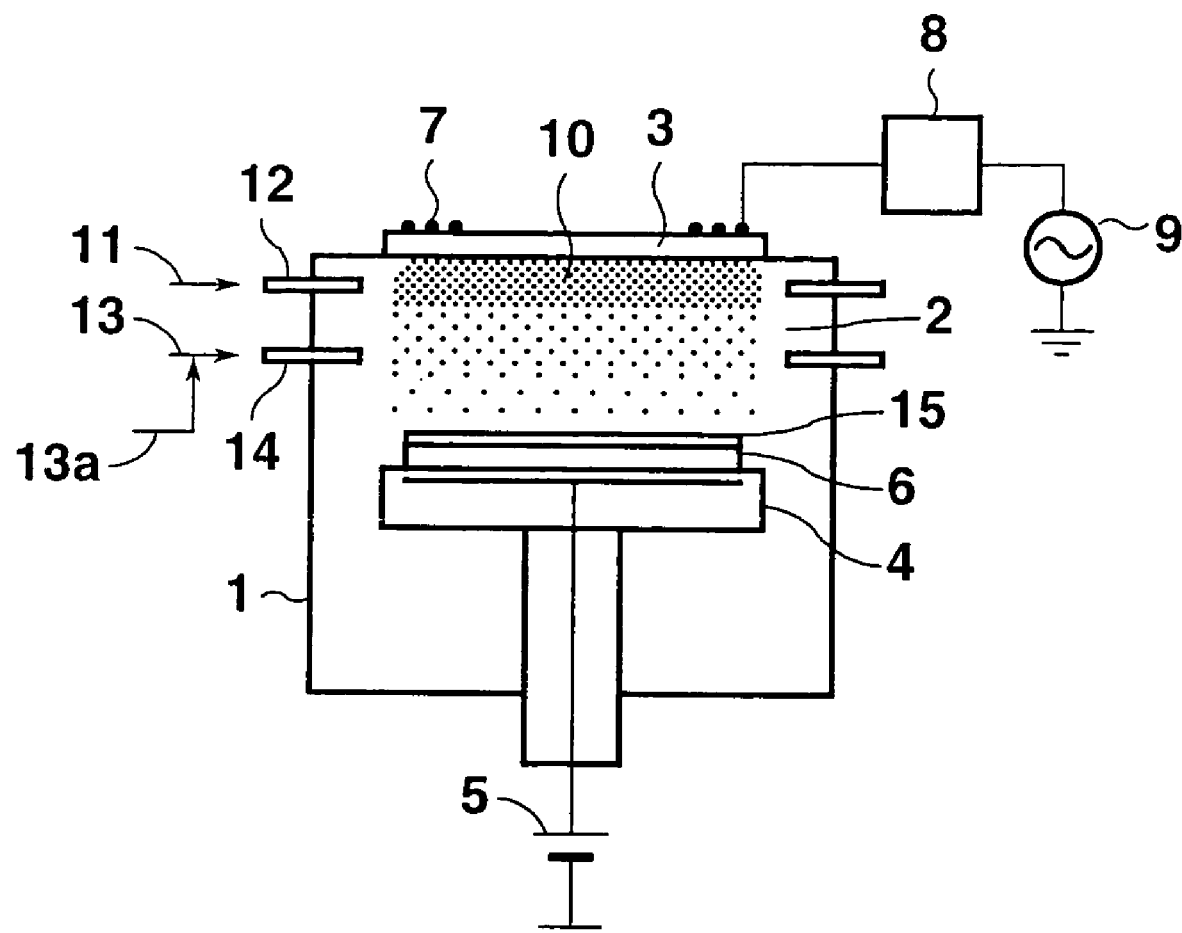
FIG. 1 is a schematic side view of a plasma CVD apparatus as a film forming apparatus for performing a film forming method according to a first embodiment of the present invention.
Figure 2:
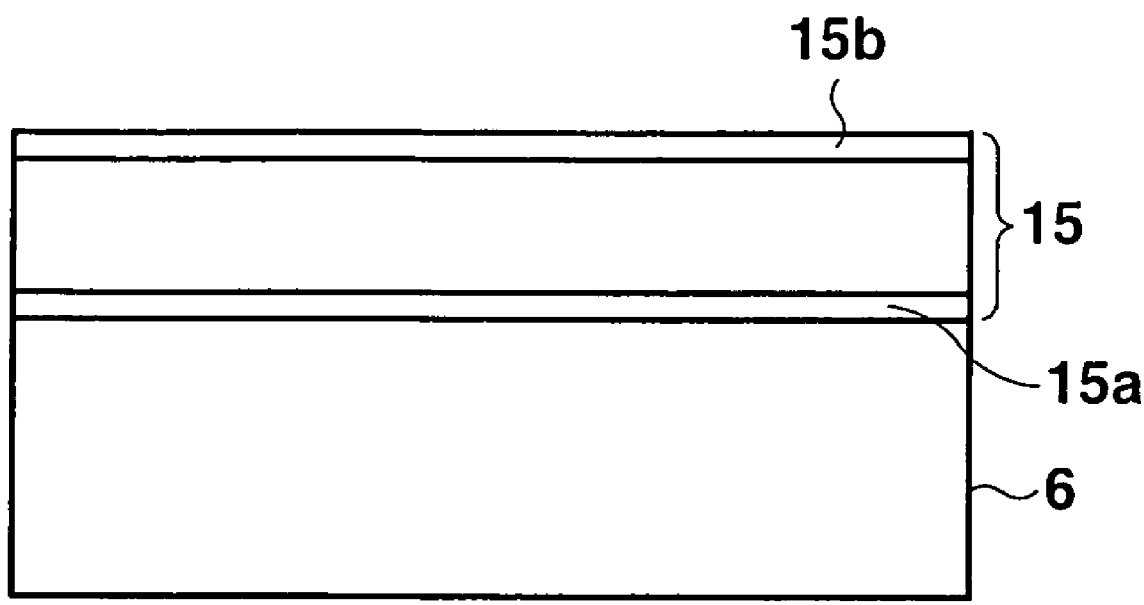
FIG. 2 is a schematic view of the state of firm formation performed by the present embodiment.
Figure 3:
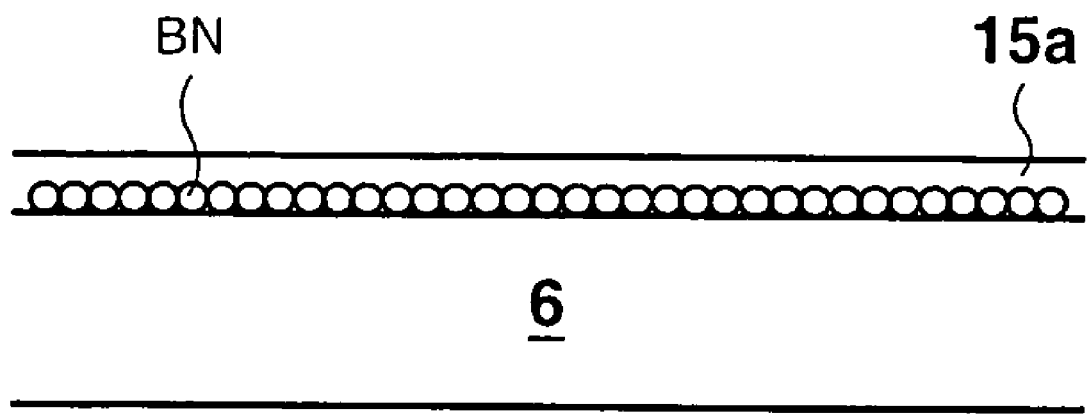
FIG. 3 is a schematic view of an interface portion.
Figure 4:
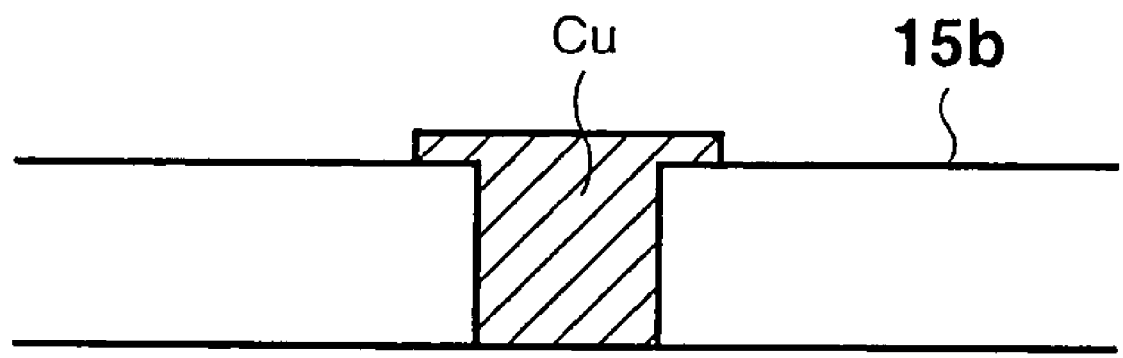
FIG. 4 is a schematic view of the state of copper wired on a surface portion.

The first embodiment is explained based on FIGS. 1 to 4. FIG. 1 schematically shows a side view of a plasma CVD apparatus as a film forming apparatus for performing the film forming method according to the first embodiment of the present invention. FIG. 2 schematically shows the state of firm formation in the present embodiment. FIG. 3 schematically shows an interface portion. FIG. 4 schematically shows the state of copper wired on a surface portion.

As shown in FIG. 1, a film formation chamber 2 is formed within a cylindrical container 1, and a circular ceiling board 3 is provided in an upper part of the container 1. An electrostatic chuck 4, as a substrate holding portion, is provided in the film formation chamber 2 at the center of the container 1. A direct current power source 5 for the electrostatic chuck is connected to the electrostatic chuck 4 so that a substrate 6 of a semiconductor (for example, a silicon wafer with a diameter of 300 mm or more) is electrostatically attracted thereto and held thereon.

A high frequency antenna 7 of a circular ring shape, for example, is disposed on the ceiling board 3, and a high frequency power source 9 is connected to the high frequency antenna 7 via a matching instrument 8. By supplying an electric power to the high frequency antenna 7, electromagnetic waves are shot into the film formation chamber 2 of the container 1. The electromagnetic waves shot into the container 1 ionize a gas within the film formation chamber 2 to generate a plasma 10 (plasma generation means).

The container 1 is provided with a nitrogen gas nozzle 12, as nitrogen gas introduction means, for introducing a nitrogen gas ($N_2$gas) 11 (>99.999%) into the film formation chamber 2. A diborane gas nozzle 14, as boron-based gas introduction means, is provided for introducing a diborane ($B_2H_6$)-containing gas 13, as a boron-based gas, to the interior of the film formation chamber 2 below the nitrogen gas nozzle 12. The $B_2H_6$-containing gas 13 introduced into the film formation chamber 2 through the diborane gas nozzle 14 is a $B_2H_6$ gas (1% to 5%) diluted with a hydrogen ($H_2$) gas.

With the above-described plasma CVD apparatus, the substrate 6 is placed on the electrostatic chuck 4 and electrostatically attracted thereto. The $N_2$ gas 11 is introduced at a predetermined flow rate through the nitrogen gas nozzle 12, while the $B_2H_6$-containing gas 13 is introduced at a predetermined flow rate through the diborane gas nozzle 14. An electric power is supplied from the high frequency power source 9 to the high frequency antenna 7 to apply high frequency waves (1 MHz to 100 MHz, 1 kW to 10 kW) via the matching instrument 8. As a result, mainly the $N_2$ gas 11 is excited within the film formation chamber 2 to change into a plasma state. After the $N_2$ gas 11 is excited, it is mixed with the $B_2H_6$-containing gas 13 and reacted thereby, whereby a boron carbonitride (BN) film 15 is formed on the substrate 6, as shown in FIG. 2. At this time, the temperature of the substrate 6 is set at 200° C. to 400° C.

At the initial stage of film formation, the flow rate of the $N_2$ gas 11 through the nitrogen gas nozzle 12 is rendered present in excess to suppress agglomeration of boron (B), thereby promoting crystallization of BN and eliminating crystal imperfection. Through these means, the occurrence of an amorphous phase at the interface 15a between the substrate 6 and the BN film 15 is suppressed. That is, as shown in FIG. 3, the amount of $N_2$ is made large at the initial stage of film formation, whereby B is decreased and BN binding is promoted to facilitate crystallization. In other words, according to the present embodiment, the nitrogen gas nozzle 12 serves as suppressing gas introduction means, and the $N_2$ gas 11 serves as an amorphous phase suppressing gas. As the suppressing gas introduction means, a nozzle for separately introducing the $N_2$ gas 11 can also be provided.

Since an amorphous phase is known to be the origin of moisture absorption, suppression of the occurrence of the amorphous phase at the interface 15a is very effective for decreasing moisture absorption. After initial-stage film formation, film formation is continued, with the flow rate ratio being returned to the usual ratio. By so doing, there is obtained the BN film 15 of the desired thickness and maintaining low dielectric constant properties. The initial-stage film formation is preferably for a period until a thickness, for example, of the order of 100 Å is obtained.

At the final stage of film formation, the flow rate of $B_2H_6$ through the diborane gas nozzle 14 is rendered present in excess, and an $H_2$ gas 13a is newly mixed into the diborane gas nozzle 14, to enhance imperfection due to B in BN, thereby promoting the occurrence of an amorphous phase at the most superficial surface 15b of the BN film 15, and also inactivating the amorphous phase. That is, the occurrence of the amorphous phase is promoted to attain a close-packed state (to increase density), and H converted to atoms by the plasma is bound to unbound seeds to inactivate the amorphous phase, thereby increasing moisture absorption resistance.

That is, according to the present embodiment, the diborane gas nozzle 14 serves as promoting gas introduction means, the line for newly mixing the $H_2$ gas 13a and the diborane gas nozzle 14 serve as inactivating gas introduction means, and the $H_2$ gas 13a serves as an amorphous phase inactivating gas. A nozzle for separately introducing the $H_2$ gas 13a may be provided to constitute the inactivating gas introduction means.

The most superficial surface 15b of the BN film 15 is normally in a rough state. Thus, if other metal (for example, copper: Cu) is wired in this condition, as shown in FIG. 4, diffusion of Cu occurs. According to the present embodiment, the flow rate of $B_2H_6$ is made an excess value at the final stage of film formation, thereby promoting the occurrence of an amorphous phase and increasing density. In addition, an amorphous phase is known to be the origin of moisture absorption, as stated earlier. Thus, the $H_2$ gas 13a is mixed to bind H to the unbound seeds, thereby inactivating the amorphous phase, namely, increasing moisture absorption resistance. Hence, diffusion of Cu is suppressed without impairment of moisture absorption resistance.

As described above, the BN film 15 is produced which has the interface 15a where the occurrence of an amorphous phase has been suppressed, and the most superficial surface 15b where the occurrence of an amorphous phase has been promoted to increase density, and where the amorphous phase has been inactivated. By so doing, moisture absorption resistance at the interface with the substrate can be improved. Furthermore, diffusion of Cu can be suppressed without impairment of moisture absorption properties.

Figure 5:
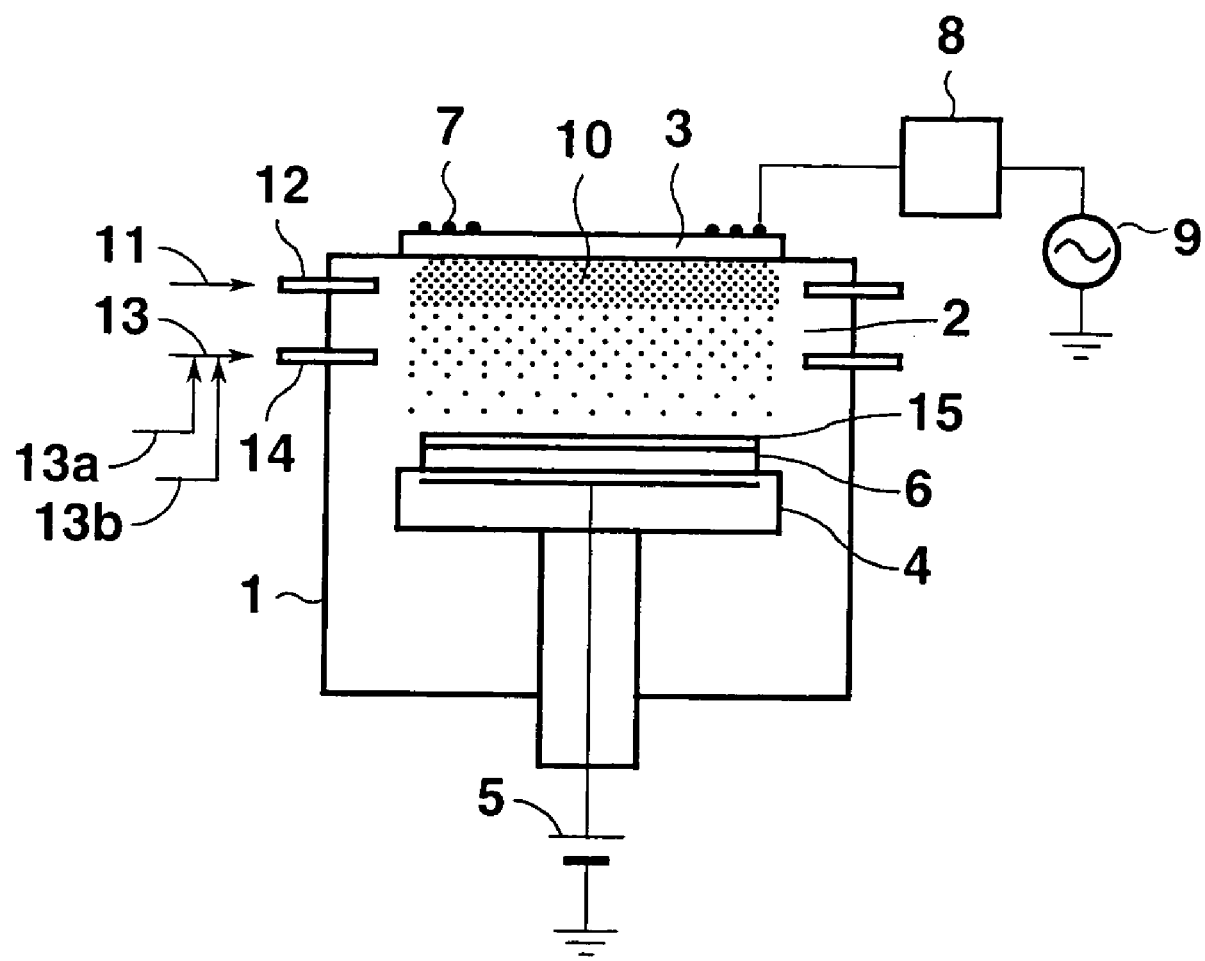
FIG. 5 is a schematic side view of a plasma CVD apparatus as a film forming apparatus for performing a film forming method according to a second embodiment of the present invention.
Figure 6:
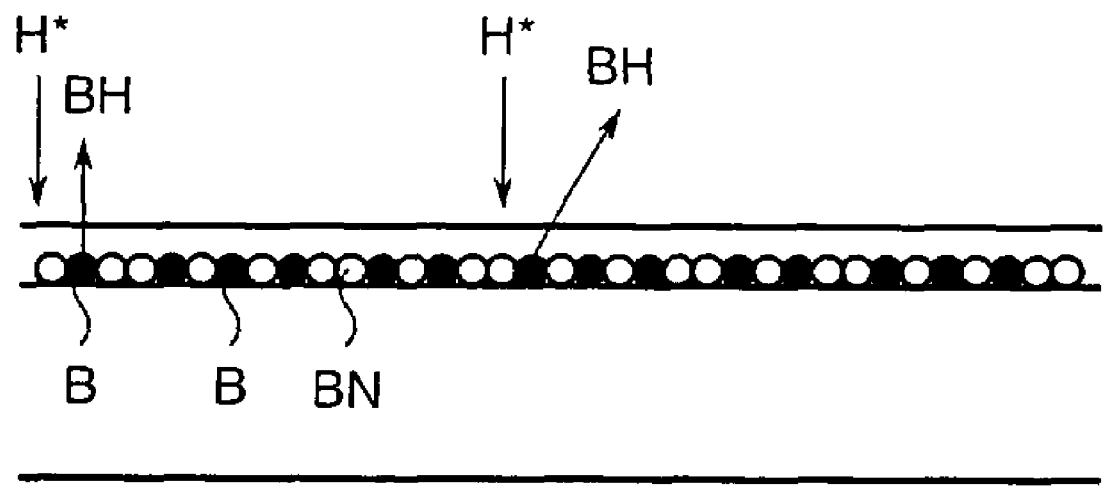
FIG. 6 is a schematic view of an interface portion of a film formed by the present embodiment.

The second embodiment will be described based on FIGS. 5 and 6. FIG. 5 is a schematic side view of a plasma CVD apparatus as a film forming apparatus for performing the film forming method according to the second embodiment of the present invention. FIG. 6 is a schematic view of an interface portion of a film formed by the present embodiment. The same constituent members as the members shown in FIGS. 1 to 4 are assigned the same numerals, and duplicate explanations are omitted.

In the present embodiment, at the initial stage of film formation, an $H_2$ gas 13b is newly incorporated further into the diborane gas nozzle 14 to render the flow rate of the $H_2$ present in excess and remove agglomeration of boron (B), thereby promoting crystallization of BN and eliminating crystal imperfection. Through these means, the occurrence of an amorphous phase at the interface 15a between the substrate 6 and the BN film 15 is suppressed. That is, as shown in FIG. 6, the amount of $H_2$ is made large at the initial stage of film formation, whereby atomic H in the plasma etches agglomerated B and vaporizes it as BH to leave only BN behind.

In other words, according to the present embodiment, the line for the further new $H_2$ gas 13b and the diborane gas nozzle 14 serve as suppressing gas introduction means, and the further new $H_2$ gas 13b serves as an amorphous phase suppressing gas. As the suppressinggas introduction means, a nozzle for separately introducing the further new $H_2$ gas 13b can also be provided.

Since an amorphous phase is known to be the origin of moisture absorption, suppression of the occurrence of the amorphous phase at the interface 15a is very effective for decreasing moisture absorption. After initial-stage film formation, film formation is continued, with the flow rate ratio being returned to the usual ratio. By so doing, there is obtained the BN film 15 of the desired thickness and maintaining low dielectric constant properties. The initial-stage film formation is preferably for a period until a thickness, for example, of the order of 100 Å is obtained.

In the present embodiment, the same treatment as in the first embodiment is performed at the final stage of film formation to form the BN film 15, as stated earlier, which has the interface 15a where the occurrence of an amorphous phase has been suppressed, and the most superficial surface 15b where the occurrence of an amorphous phase has been promoted to increase density, and where the amorphous phase has been inactivated. By so doing, moisture absorption resistance at the interface with the substrate can be improved. Furthermore, diffusion of Cu can be suppressed without impairment of moisture absorption properties.

Figure 7:
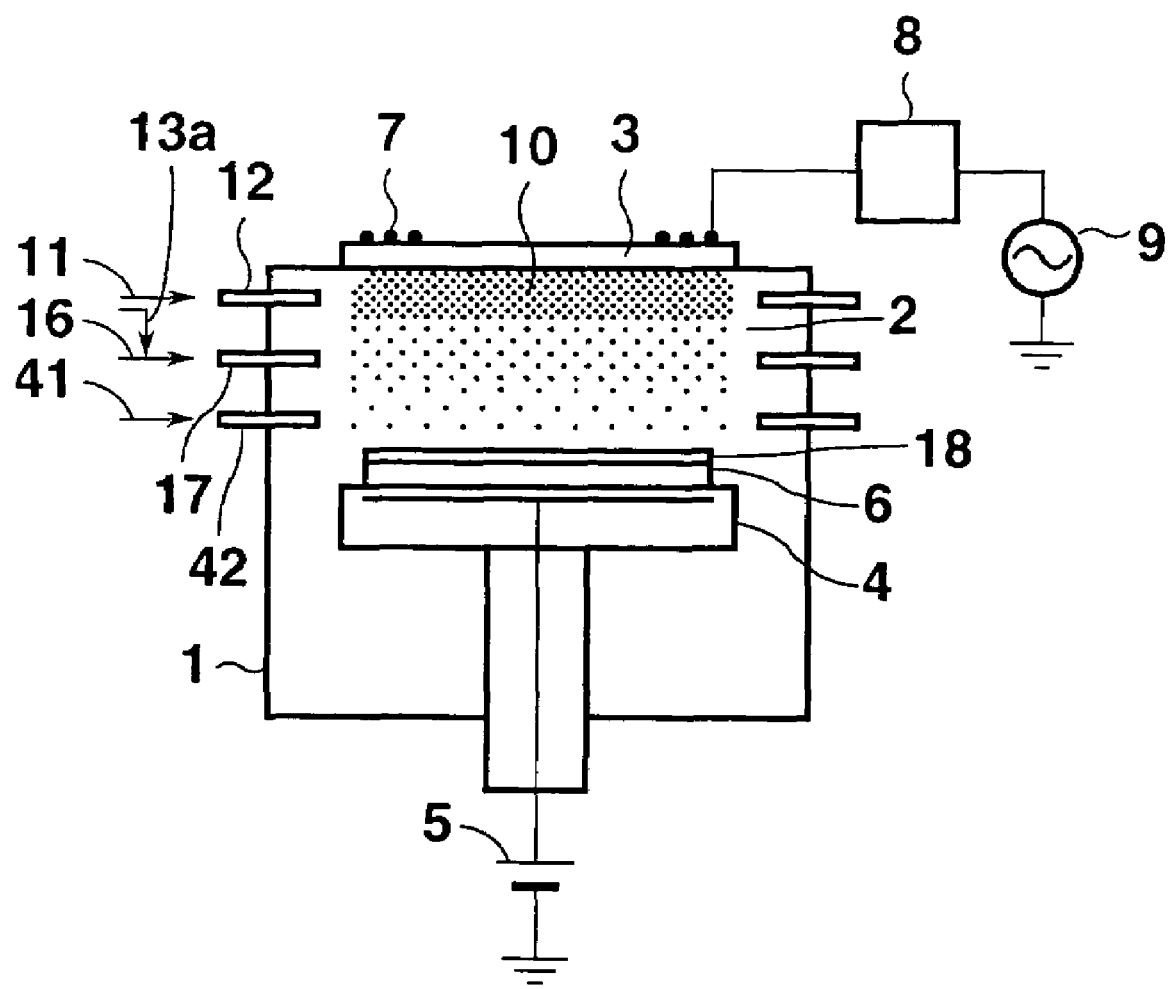
FIG. 7 is a schematic side view of a plasma CVD apparatus as a film forming apparatus for performing a film forming method according to a third embodiment of the present invention.

The third embodiment will be described based on FIG. 7. FIG. 7 is a schematic side view of a plasma CVD apparatus as a film forming apparatus for performing the film forming method according to the third embodiment of the present invention. The same constituent members as the members shown in FIGS. 1 to 4 are assigned the same numerals, and duplicate explanations are omitted.

The container 1 is provided with a nitrogen gas nozzle 12 for introducing a nitrogen gas ($N_2$ gas) 11 (>99.999%) into the film formation chamber 2. A mixed gas nozzle 17, as boron-based gas introduction means, is provided for introducing a diborane($B_2H_6$)-containing gas, as a boron-based gas, and a tetraethoxysilane ($Si(O-C_2H_5)_4$; hereinafter referred to as TEOS) gas, as an organic gas, i.e., ($B_2H_6$-containing gas+TEOS gas) 16, to the interior of the film formation chamber 2 below the nitrogen gas nozzle 12. The $B_2H_6$-containing gas introduced into the film formation chamber 2 through the mixed gas nozzle 17 is a $B_2H_6$ gas (1% to 5%) diluted with a hydrogen ($H_2$) gas.

Ethanol or acetone can be employed as the organic gas.

A hydrocarbon-based gas nozzle 42, as suppressing gas introduction means, is provided for introducing a hydrocarbon-based gas (for example, methane: $CH_4$) 41, as an amorphous phase occurrence suppressing gas, into the interior of the film formation chamber 2 below the mixed gas nozzle 17. $CH_4$ 41 is introduced through the hydrocarbon-based gas nozzle 42 at the initial stage of film formation. As the amorphous phase occurrence suppressing gas, it is possible to apply the $N_2$ gas 11 shown in the first embodiment, or the $H_2$ gas 13b shown in the second embodiment.

With the above-described plasma CVD apparatus, the $N_2$ gas 11 is introduced at a predetermined flow rate through the nitrogen gas nozzle 12, while the ($B_2H_6$-containing gas+TEOS gas) 16 is introduced at a predetermined flow rate through the mixed gas nozzle 17. An electric power is supplied from the high frequency power source 9 to the high frequency antenna 7 to apply high frequency waves (1 MHz to 100 MHz, 1 kW to 10 kW) via the matching instrument 8. As a result, mainly the $N_2$ gas 11 is excited within the film formation chamber 2 to change into a plasma state. After the $N_2$ gas 11 is excited, it is mixed with the ($B_2H_6$-containing gas+TEOS gas) 16 and reacted thereby, whereby a boron carbonitride (BNC) film 18 is formed on the substrate 6. At this time, the temperature of the substrate 6 is set at 200° C. to 400° C.

At the initial stage of film formation, the $CH_4$ 41 is introduced through the hydrocarbon-based gas nozzle 42 to suppress agglomeration of boron (B), thereby promoting crystallization of BNC and eliminating crystal imperfection. Through these means, the occurrence of an amorphous phase at the interface between the substrate 6 and the BNC film 18 is suppressed. That is, $CH_4$ 41 is introduced at the initial stage of film formation, whereby $CH_4$ is converted into $CH_3$+atomic H in the plasma. The atomic H etches agglomerated B and vaporizes it as BH. Carbon binds to BN, promoting crystallization of BNC.

Since an amorphous phase is known to be the origin of moisture absorption, suppression of the occurrence of the amorphous phase at the interface is very effective for decreasing moisture absorption. After initial-stage film formation, film formation is continued, with the flow rate ratio being returned to the usual ratio. By so doing, there is obtained the BNC film 18 of the desired thickness and maintaining low dielectric constant properties. The initial-stage film formation is preferably for a period until a thickness, for example, of the order of 100 Å is obtained.

At the final stage of film formation, the flow rate of $B_2H_6$ through the mixed gas nozzle 17 is rendered present in excess, and an $H_2$ gas 13a is newly mixed into the mixed gas nozzle 17, to enhance imperfection due to B in BNC, thereby promoting the occurrence of an amorphous phase at the most superficial surface of the BNC film 18, and also inactivating the amorphous phase. That is, the occurrence of the amorphous phase is promoted to attain a close-packed state (to increase density), and H converted to atoms by the plasma is bound to unbound seeds to inactivate the amorphous phase, increasing moisture absorption resistance.

That is, according to the present embodiment, the mixed gas nozzle 17 serves as promoting gas introduction means, the line for newly incorporating the $H_2$ gas 13a and the mixed gas nozzle 17 serve as inactivating gas introduction means, and the $H_2$ gas 13a serves as an amorphous phase inactivating gas. A nozzle for separately introducing the $H_2$ gas 13a may be provided to constitute the inactivating gas introduction means.

The most superficial surface of the BNC film 18 is normally in a rough state. Thus, if other metal (for example, copper: Cu) is wired in this condition, diffusion of Cu occurs. According to the present embodiment, the flow rate of $B_2H_6$ is made an excess value at the final stage of film formation, thereby promoting the occurrence of an amorphous phase and increasing density. In addition, an amorphous phase is known to be the origin of moisture absorption, as stated earlier. Thus, the $H_2$ gas 13a is incorporated to bind H to unbound seeds, thereby inactivating the amorphous phase, namely, increasing moisture absorption resistance. Hence, diffusion of Cu is suppressed without impairment of moisture absorption resistance.

As described above, the BNC film 18 is produced which has the interface where the occurrence of an amorphous phase has been suppressed, and the most superficial surface where the occurrence of an amorphous phase has been promoted to increase density, and where the amorphous phase has been inactivated. By so doing, moisture absorption resistance at the interface with the substrate can be improved. Furthermore, diffusion of Cu can be suppressed without impairment of moisture absorption properties.

Figure 8:
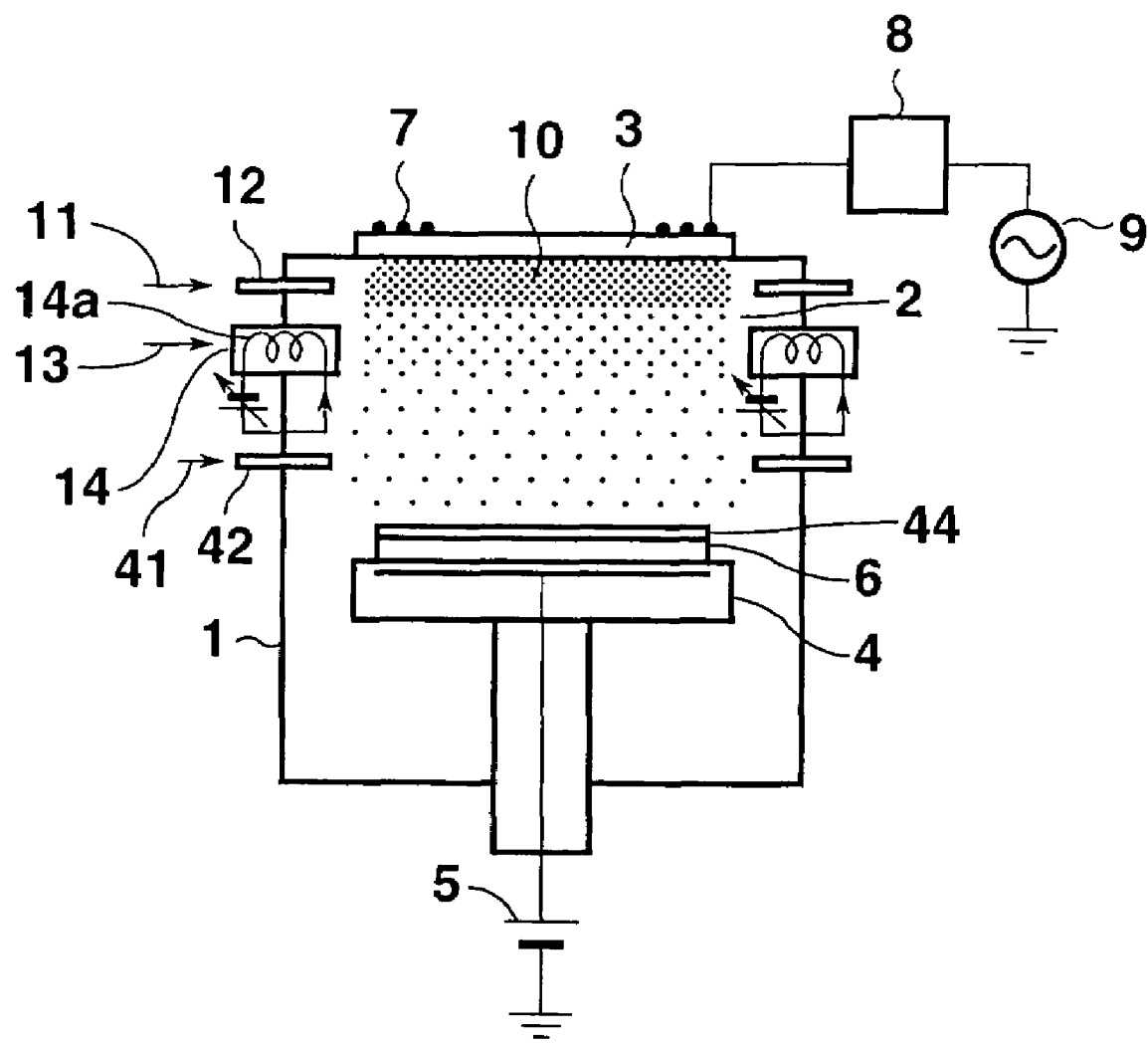
FIG. 8 is a schematic side view of a plasma CVD apparatus as a film forming apparatus for performing a film forming method according to a fourth embodiment of the present invention.

The fourth embodiment will be described based on FIG. 8. FIG. 8 is a schematic side view of a plasma CVD apparatus as a film forming apparatus for performing the film forming method according to the fourth embodiment of the present invention. The same constituent members as the members shown in FIGS. 1 to 4 are assigned the same numerals, and duplicate explanations are omitted.

The container 1 is provided with a nitrogen gas nozzle 12, as nitrogen gas introduction means, for introducing a nitrogen gas ($N_2$ gas) 11 (>99.999%) into the film formation chamber 2. A diborane gas nozzle 14, as boron-based gas introduction means, is provided for introducing a diborane ($B_2H_6$)-containing gas 13, as a boron-based gas, to the interior of the film formation chamber 2 below the nitrogen gas nozzle 12. The $B_2H_6$-containing gas 13 introduced into the film formation chamber 2 through the diborane gas nozzle 14 is a $B_2H_6$ gas (1% to 5%) diluted with a hydrogen ($H_2$) gas. A winding-shaped carbon heater 14a is installed within the diborane gas nozzle 14, and the winding-shaped carbon heater 14a is temperature-controlled within the range of 1,000° C. to 3,000° C. by electric current control, whereby the amount of carbon evaporated is adjusted.

A hydrocarbon-based gas nozzle 42, as suppressing gas introduction means, is provided for introducing a hydrocarbon-based gas (for example, methane: $CH_4$) 41, as an amorphous phase occurrence suppressing gas, into the interior of the film formation chamber 2 below the diborane gas nozzle 14. The $CH_4$ 41 is introduced through the hydrocarbon-based gas nozzle 42 at the initial stage of film formation. As the amorphous phase occurrence suppressing gas, it is possible to apply the $N_2$ gas 11 shown in the first embodiment, or the $H_2$ gas 13b shown in the second embodiment.

With the above-described plasma CVD apparatus, a substrate 6 is placed on an electrostatic chuck 4 and electrostatically attracted thereto. The $N_2$ gas 11 is introduced at a predetermined flow rate through the nitrogen gas nozzle 12, while the $B_2H_6$-containing gas 13 is introduced at a predetermined flow rate through the diborane gas nozzle 14 equipped with the winding-shaped carbon heater 14a. Solid-phase carbon is evaporated by heating of the winding-shaped carbon heater 14a. An electric power is supplied from the high frequency power source 9 to the high frequency antenna 7 to apply high frequency waves (1 MHz to 100 MHz, 1 kW to 10 kW) via the matching instrument 8. As a result, mainly the $N_2$ gas 11 is excited within the film formation chamber 2 to change into a plasma state. After the $N_2$ gas 11 is excited, it is mixed with the $B_2H_6$-containing gas 13 and the evaporated gas from the solid-phase carbon source, and reacted thereby, whereby a boron carbonitride (BNC) film 44 is formed on the substrate 6, with the temperature being controlled by the winding-shaped carbon heater 14a or the amount of evaporated carbon being controlled. At this time, the temperature of the substrate 6 is set at 200° C. to 400° C.

At the initial stage of film formation, the $CH_4$ 41 is introduced through the hydrocarbon-based gas nozzle 42 to suppress agglomeration of boron (B), thereby promoting crystallization of BNC and eliminating crystal imperfection. Through these means, the occurrence of an amorphous phase at the interface between the substrate 6 and the BNC film 44 is suppressed. That is, the $CH_4$ 41 is introduced at the initial stage of film formation, whereby $CH_4$ is converted into $CH_3$+atomic H in the plasma. The atomic H etches agglomerated B and vaporizes it as BH. Carbon binds to BN, promoting crystallization of BNC.

Since an amorphous phase is known to be the origin of moisture absorption, suppression of the occurrence of the amorphous phase at the interface is very effective for decreasing moisture absorption. After initial-stage film formation, film formation is continued, with the flow rate ratio being returned to the usual ratio. By so doing, there is obtained the BNC film 44 of the desired thickness and maintaining low dielectric constant properties. The initial-stage film formation is preferably for a period until a thickness, for example, of the order of 100 Å is obtained.

At the final stage of film formation, the flow rate of $B_2H_6$ through the diborane gas nozzle 14 is rendered present in excess, and the $H_2$ gas 13a is newly mixed into the diborane gas nozzle 14, to enhance imperfection due to B in BNC, thereby promoting the occurrence of an amorphous phase at the most superficial surface of the BNC film 44, and also inactivating the amorphous phase. That is, the occurrence of the amorphous phase is promoted to attain a close-packed state (to increase density), and H converted to atoms by the plasma is bound to unbound seeds to inactivate the amorphous phase, thereby increasing moisture absorption resistance.

As the boron-based gas, boron chloride ($BCl_3$) can be applied instead of the $B_2H_6$-containing gas. In this case, the flow rate of $BCl_3$ is rendered present in excess at the final stage of film formation, whereby imperfection due to B in BNC is enhanced to attain a close-packed state (to increase density).

That is, according to the present embodiment, the diborane gas nozzle 14 serves as promoting gas introduction means, the line for newly incorporating the $H_2$ gas 13a and the diborane gas nozzle 14 serve as inactivating gas introduction means, and the $H_2$ gas 13a serves as an amorphous phase inactivating gas. A nozzle for separately introducing the $H_2$ gas 13a may be provided to constitute the inactivating gas introduction means.

The most superficial surface of the BNC film 44 is normally in a rough state. Thus, if other metal (for example, copper: Cu) is wired in this condition, diffusion of Cu occurs. According to the present embodiment, the flow rate of $B_2H_6$ is made an excess value at the final stage of film formation, thereby promoting the occurrence of an amorphous phase and increasing density. In addition, an amorphous phase is known to be the origin of moisture absorption, as stated earlier. Thus, the $H_2$ gas 13a is incorporated to bind H to unbound seeds, thereby inactivating the amorphous phase, namely, increasing moisture absorption resistance. Hence, diffusion of Cu is suppressed without impairment of moisture absorption resistance.

As described above, the BNC film 44 is produced which has the interface where the occurrence of an amorphous phase has been suppressed, and the most superficial surface where the occurrence of an amorphous phase has been promoted to increase density, and where the amorphous phase has been inactivated. By so doing, moisture absorption resistance at the interface with the substrate can be improved. Furthermore, diffusion of Cu can be suppressed without impairment of moisture absorption properties.

In the foregoing first to fourth embodiments, the use of the new $H_2$ gas 13a as the amorphous phase inactivating gas has been taken as an example for illustration. However, with the plasma being stopped, a hydrocarbon material, e.g., methane ($CH_4$), as the amorphous phase inactivating gas can be heated, for example, by a tungsten heater and introduced (introduced under vacuum conditions). At this time, $CH_4$ is converted into $CH_3$+H upon heating, and H binds to unbound seeds to inactivate the amorphous phase in the same manner as stated above. As the amorphous phase inactivating gas, moreover, a mixture of a hydrocarbon material such as methane ($CH_4$) and a hydride such as an $H_2$ gas can be heated, for example, by a tungsten heater and introduced (introduced under vacuum conditions).

The above-described first to fourth embodiments have also shown examples in which the treatment at the initial stage of film formation and the treatment at the final stage of film formation were both performed. However, only one of the treatments can be performed. A combination of the techniques for treatments may be a suitable combination of the techniques shown in the first to fourth embodiments.

INDUSTRIAL APPLICABILITY

As described above, the invention provides the film forming method and the film forming apparatus which can form a boron nitride film improved in moisture absorption resistance at the interface with a substrate and maintaining low dielectric constant properties.

The invention claimed is:

1. A film forming method comprising the steps of:
   providing a substrate in a film formation chamber;
   filling the film formation chamber with nitrogen gas to prevent formation of an amorphous phase on the substrate;
   generating a plasma within the film formation chamber;
   exciting the nitrogen gas within the film formation chamber; and, at a final stage of film formation,
   mixing a boron-based gas with the excited nitrogen gas to react the boron and nitrogen, thereby forming an amorphous boron nitride film on the substrate.

2. A film forming method comprising generating a plasma within a film formation chamber, exciting a nitrogen gas within the film formation chamber, and then mixing the excited nitrogen gas with a boron-based gas to react them, thereby forming a boron nitride film on a substrate, wherein a flow rate of the boron-based gas is provided in excess at a final stage of film formation to promote occurrence of an amorphous phase on a surface of the film, and a hydride is mixed in to inactivate the amorphous phase.

3. A film forming method comprising generating a plasma within a film formation chamber, exciting a nitrogen gas within the film formation chamber, and then mixing the excited nitrogen gas with a boron-based gas and an organic gas or evaporated carbon to react them, thereby forming a boron carbonitride film on a substrate, wherein a flow rate of the boron-based gas is provided in excess at a final stage of film formation to promote occurrence of an amorphous phase on a surface of the film, and an amorphous phase inactivating gas is mixed in to inactivate the amorphous phase.

4. A film forming method comprising generating a plasma within a film formation chamber, exciting a nitrogen gas within the film formation chamber, and then mixing the excited nitrogen gas with a boron-based gas and an organic gas or evaporated carbon to react them, thereby forming a boron carbonitride film on a substrate, wherein a flow rate of the boron-based gas is provided in excess at a final stage of film formation to promote occurrence of an amorphous phase on a surface of the film, and a hydride is mixed in to inactivate the amorphous phase.

5. A film forming method comprising generating a plasma within a film formation chamber, exciting a nitrogen gas within the film formation chamber, and then mixing the excited nitrogen gas with a boron-based gas and an organic gas or evaporated carbon to react them, thereby forming a boron carbonitride film on a substrate, wherein a flow rate of the boron-based gas is provided in excess at a final stage of film formation to promote occurrence of an amorphous phase on a surface of the film, and the plasma is stopped and a hydrocarbon material is mixed in to inactivate the amorphous phase.

6. A film forming method comprising generating a plasma within a film formation chamber, exciting a nitrogen gas within the film formation chamber, and then mixing the excited nitrogen gas with a boron-based gas and an organic gas or evaporated carbon to react them, thereby forming a boron carbonitride film on a substrate, wherein a flow rate of the boron-based gas is provided in excess at a final stage of film formation to promote occurrence of an amorphous phase on a surface of the film, and the plasma is stopped and a hydrocarbon material is mixed in to inactivate the amorphous phase.

7. A film forming method comprising
   generating a plasma within a film formation chamber,
   exciting a nitrogen gas within the film formation chamber, and then
   mixing the excited nitrogen gas with a boron-based gas to react them, thereby forming a boron nitride film on a substrate,
   supplying an amorphous phase occurrence suppressing gas at an initial stage of film formation to suppress occurrence of an amorphous phase on an interface,
   providing a flow rate of the boron-based gas in excess at a final stage of film formation to promote occurrence of an amorphous phase on a surface of the film, and
   mixing in an amorphous phase inactivating gas to inactivate the amorphous phase.

8. A film forming method comprising
   generating a plasma within a film formation chamber,
   exciting a nitrogen gas within the film formation chamber, and then
   mixing the excited nitrogen gas with a boron-based gas and an organic gas or evaporated carbon to react them, thereby forming a boron carbonitride film on a substrate,
   supplying an amorphous phase occurrence suppressing gas at an initial stage of film formation to suppress occurrence of an amorphous phase on an interface,
   providing a flow rate of the boron-based gas present in excess at a final stage of film formation to promote occurrence of an amorphous phase on a surface of the film, and
   mixing in an amorphous phase inactivating gas to inactivate the amorphous phase.

9. The film forming method of any one of claims 1 to 8, characterized in that the boron-based gas is a diborane gas diluted with a hydrogen gas.

* * * * *